US008553808B2

(12) United States Patent
Luthra (10) Patent No.: US 8,553,808 B2
(45) Date of Patent: Oct. 8, 2013

(54) METHOD AND APPARATUS FOR DETECTING THE PRESENCE OF A SIGNAL IN A FREQUENCY BAND USING NON-UNIFORM SAMPLING

(75) Inventor: Ajay K. Luthra, San Diego, CA (US)

(73) Assignee: Motorola Mobility LLC, Libertyville, IL (US)

( * ) Notice: Subject to any disclaimer, the term of this patent is extended or adjusted under 35 U.S.C. 154(b) by 1470 days.

(21) Appl. No.: 11/609,980

(22) Filed: Dec. 13, 2006

(65) Prior Publication Data

US 2008/0143573 A1   Jun. 19, 2008

(51) Int. Cl.
*H04L 27/06*   (2006.01)

(52) U.S. Cl.
USPC ........... 375/340; 375/130; 375/140; 375/295; 375/316; 375/342

(58) Field of Classification Search
USPC ......... 375/130, 135–137, 145–148, 150, 245, 375/260, 295, 316, 342, 343, 355, 242, 250, 375/254, 267, 359, 371, 340, 43
See application file for complete search history.

(56) References Cited

U.S. PATENT DOCUMENTS

| | | | |
|---|---|---|---|
| 4,926,186 A | 5/1990 | Kelly et al. | |
| 5,323,337 A | 6/1994 | Wilson et al. | |
| 5,489,903 A | 2/1996 | Wilson et al. | |
| 6,560,331 B1 * | 5/2003 | Cooklev et al. | 379/283 |
| 6,763,106 B1 | 7/2004 | Li et al. | |
| 7,064,694 B1 * | 6/2006 | Male et al. | 341/129 |
| 7,460,583 B2 * | 12/2008 | Khayrallah et al. | 375/148 |
| 7,489,745 B2 * | 2/2009 | Fudge | 375/340 |
| 7,573,956 B2 * | 8/2009 | Lazar et al. | 375/340 |
| 7,606,335 B2 * | 10/2009 | Kloper et al. | 375/340 |
| 7,656,970 B1 * | 2/2010 | Sankabathula et al. | 375/316 |
| 7,873,097 B1 * | 1/2011 | Luecke et al. | 375/147 |
| 2005/0156775 A1 | 7/2005 | Petre et al. | |
| 2007/0086544 A1 * | 4/2007 | Fudge et al. | 375/316 |
| 2007/0100922 A1 * | 5/2007 | Ashish | 708/400 |
| 2008/0019464 A1 * | 1/2008 | Kloper et al. | 375/340 |
| 2009/0222226 A1 * | 9/2009 | Baraniuk et al. | 702/66 |
| 2009/0268830 A1 * | 10/2009 | Birru et al. | 375/260 |
| 2010/0049470 A1 * | 2/2010 | Szajnowski | 702/159 |

FOREIGN PATENT DOCUMENTS

| | | |
|---|---|---|
| EP | 1093086 A | 4/2001 |
| JP | 57010527 A | 1/1982 |
| WO | 0179877 A2 | 10/2001 |

OTHER PUBLICATIONS

N. Sayiner; A Non-Uniform Sampling Technique for A/D conversion, IEEE 1993.*

(Continued)

*Primary Examiner* — Hirdepal Singh
(74) *Attorney, Agent, or Firm* — Sylvia Chen (57) ABSTRACT

A method and apparatus for detecting the presence of a signal in a frequency band using non-uniform sampling includes an analog to digital converter (ADC) (110) for sampling an analog input signal (105) to create discrete signal samples (115), an ADC exciter (120) for exciting the ADC to sample at non-uniform time periods, a digital filter (130) for converting the discrete signal samples into an energy versus frequency spectrum (300), and an energy comparator (140) coupled to an output of the digital filter. The energy comparator (140) detects the presence of any frequency bands exceeding an energy setpoint.

18 Claims, 4 Drawing Sheets

(56) References Cited

OTHER PUBLICATIONS

Letizia Lo Presti et al: "Two-Dimensional Random Adaptive Sampling for Image Scanning" IEEE Transactions on Geoscience and Remote Sensing, IEEE Service Center, Piscataway, NJ, USA, vol. 38, No. 6, Nov. 2000, XP011021632 ISSN: 0196-2892.
I. Bilinskis, "Avoiding Aliasing by Nonuniform Sampling", http://www.edi.lv/dasp-web/sec-5.htm, 8 pages.
Leslie Greengard and June-Yub Lee; "Accelerating the Nonuniform Fast Fourier Transform"; Society for Industrial and Applied Mathematics (SIAM) Review; 2004; pp. 443-454; vol. 46, No. 3.
Patent Cooperation Treaty; "Notification of Transmittal of the International Search Report and the Written Opinion of the International Searching Authority, or the Declaration" for International Application No. PCT/US2007/074682; Feb. 12, 2008; 14 pages.
European Patent Office; "Communication pursuant to Article 94(3) EPC" for Application No. 07 813 514.4-2206; Oct. 1, 2009; 5 pages.
European Patent Office, "Summons to attend oral proceedings pursuant to Rule 115(1) EPC" for Application No. 07813514.2, Jul. 6, 2010, 6 pages.
Korean Intellectual Proptery Office (KIPO), "Notice of Preliminary Rejection" for Korean Patent Application No. 10-2009-7012279, Dec. 14, 2010, 7 pages.
Mati Wax and Thomas Kailath, "Detection of Signals by Information Theoretic Criteria", IEEE Trans. on Acoustics, Speech, and Signal Processing, Apr. 1985, pp. 387-392, vol. ASSP-33 No. 2.
The State Intellectual Proptery Office (SIPO) of the People'S Republic of China, "Notification of the First Office Action" for Chinese Patent Application No. 200780046267.2, Dec. 24, 2010, 12 pages.
Bilinskis, "Avoiding Aliasing by Nonuniform Sampling", http://edi.lv/dasp-web/sec-5.htm, 8 pages, Dec. 8, 2006.
Korean Intellectual Proptery Office (KIPO), "Notice of Preliminary Rejection" for Korean Patent Application No. 10-2009-70122279, Nov. 26, 2012, 5 pages.
Yonina C. Eldar and Alan V. Oppenheim, "Filterbank Reconstruction of Bandlimited Signals from Nonuniform and Generalized Samples," IEEE Trans. on Signal Processing, Oct. 2000, pp. 2864-2875, vol. 48 No. 10.
Danijela Cabric et al., "Implementation Issues in Spectrum Sensing for Cognitive Radios," Proc. of IEEE Conf. on Signals, Systems and Computers, Nov. 2004, pp. 772-776.

* cited by examiner

METHOD AND APPARATUS FOR DETECTING THE PRESENCE OF A SIGNAL IN A FREQUENCY BAND USING NON-UNIFORM SAMPLING

FIELD OF THE DISCLOSURE

The present disclosure generally relates to signal processing. More particularly, the disclosure relates to a technique using non-uniform sampling for detecting the presence of a signal in a frequency band.

BACKGROUND

In order to detect the presence of a signal in a frequency band, usually an input signal is uniformly sampled in the time domain and converted to the frequency domain. Then the frequency domain spectrum is analyzed for energy peaks indicating the possible presence of a signal. One problem with such an approach is that, at high frequencies, a large number of samples need to be taken in order to overcome aliasing. Such a large number of samples require a large amount of processing and power which tends to stress the receiver.

BRIEF DESCRIPTION OF THE DRAWINGS

The accompanying figures, where like reference numerals refer to identical or functionally similar elements throughout the separate views, and which together with the detailed description below are incorporated in and form part of the specification, serve to further illustrate various embodiments and to explain various principles and advantages all in accordance with the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present disclosure, it should be observed that the embodiments reside primarily in searching a signal in a large frequency band. It includes receiving an analog signal, non-uniformly sampling the analog signal, converting the input signal to frequency domain, and analyzing the frequency domain spectrum to detect a potential presence of a desired signal in the frequency band. Accordingly, the apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

Figure 1:
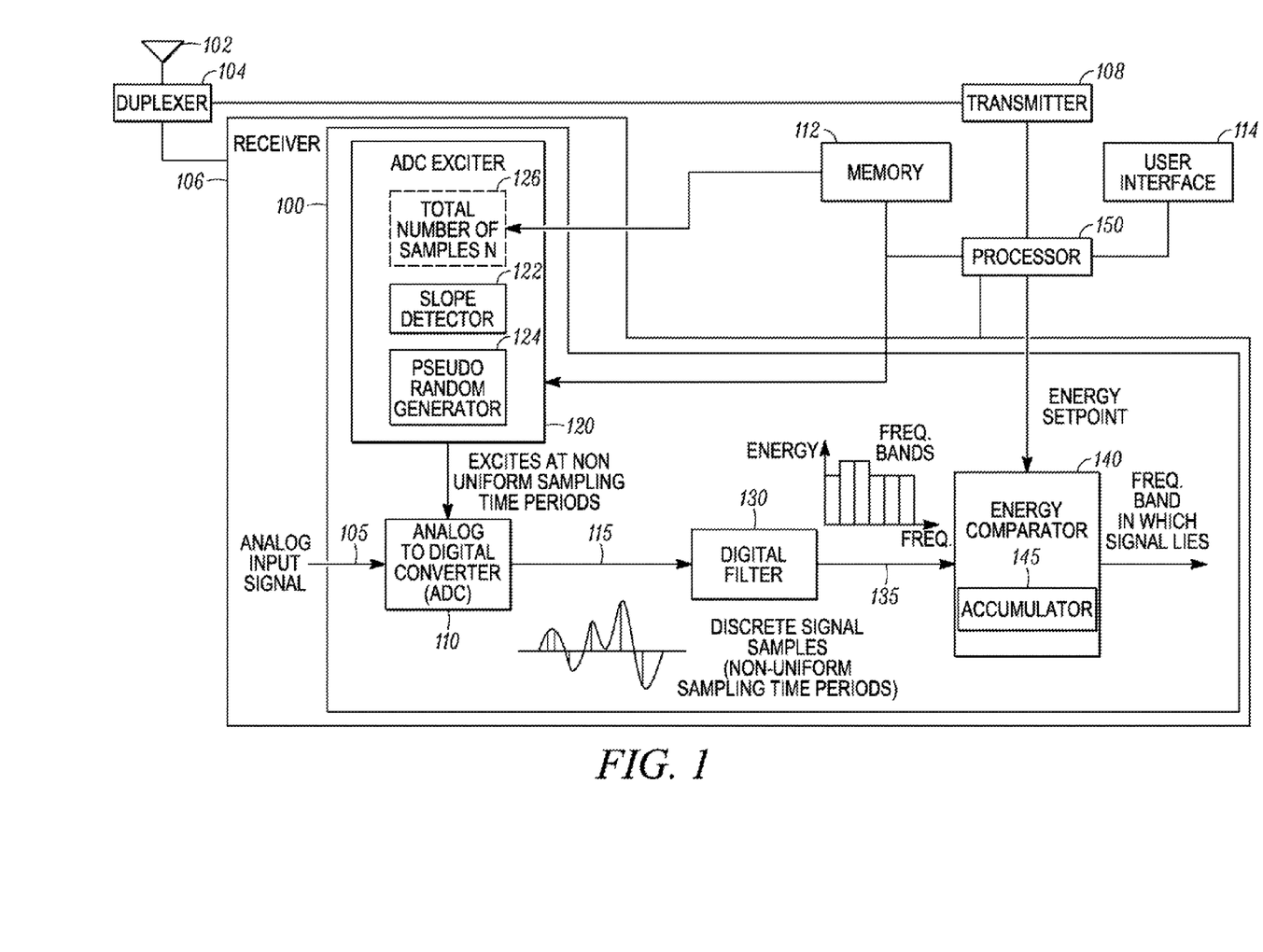
FIG. 1 shows a block diagram of a mobile device incorporating a signal detector using non-uniform sampling in accordance with an embodiment.

FIG. 1 shows a block diagram of a mobile device incorporating a signal detector 100. The mobile device includes a user interface 114 for receiving user input such as voice or data from a microphone or keypad, a processor 150, a transmitter 108 for transmitting a signal out through a duplexer 104 and an antenna 102, a receiver 106 for receiving a signal through the antenna 102 and the duplexer 104, and a memory 112. The user interface 114, for example, can include a microphone, an ear piece, a display, a keyboard, and so on. The antenna 102 receives and transmits signals. The memory 112 is used for storage. The duplexer 104 is responsible for simultaneous transmission and reception of signals with the assistance of the transmitter 108 for transmitting and the receiver 106 for receiving. The receiver 106 includes the signal detector 100. The processor 150 and the memory 112 are connected to the signal detector 100.

The signal detector 100 has an analog to digital converter (ADC) 110, an ADC exciter 120, a digital filter 130, an energy comparator 140, and is coupled to the processor 150. When operational, the signal detector 100 detects the presence of a signal in a frequency band. It helps to reduce the amount of processing in a wireless communication device (e.g., the mobile device shown in FIG. 1) in a communication system while avoiding aliasing. The signal detector can use a slower average sampling rate and a significantly smaller number of samples for detecting the potential presence of a desired signal in a frequency band. This is done by sampling the analog input signal non-uniformly to produce non-uniform discrete signal samples.

Figure 4:
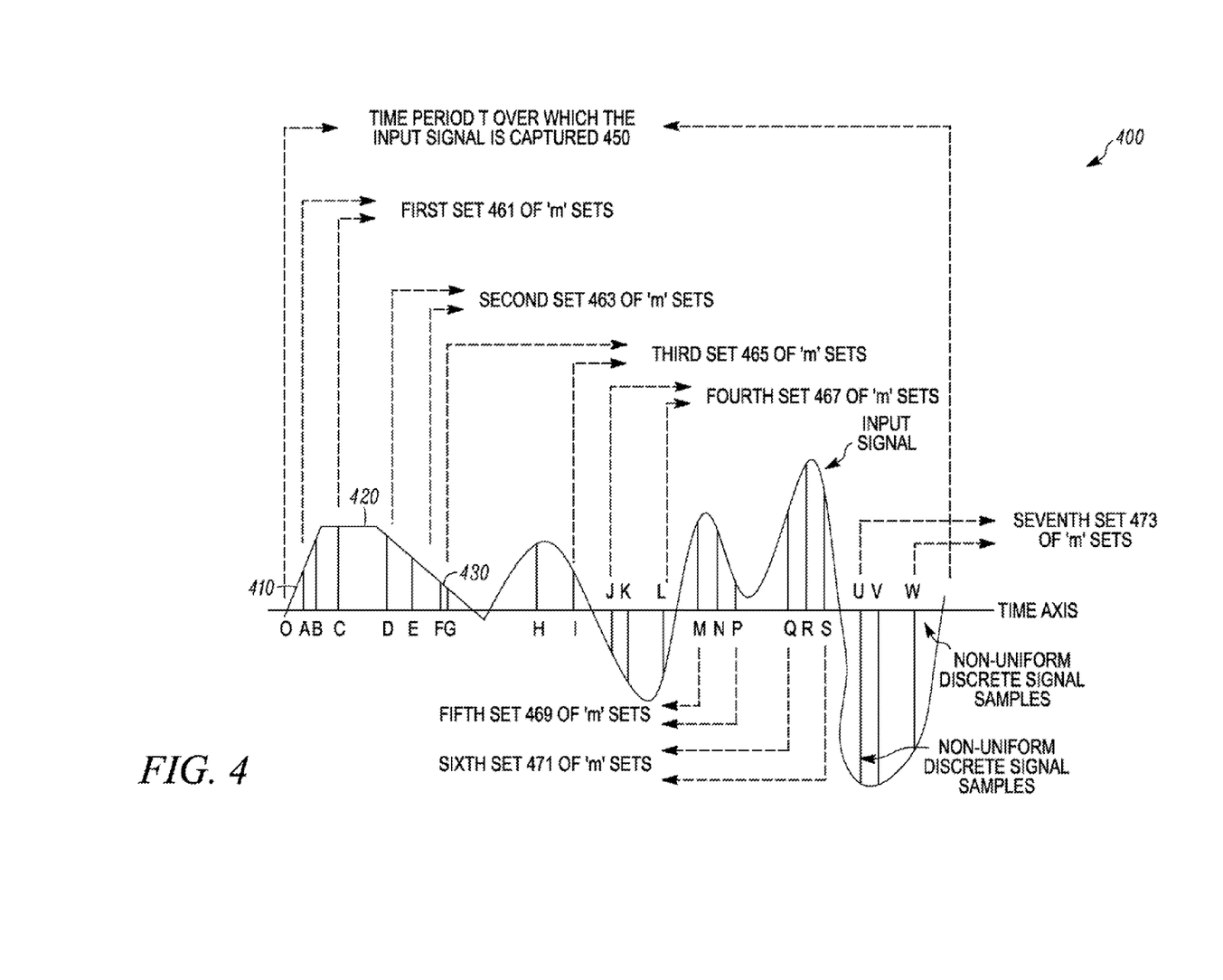
FIG. 4 shows an example of non-uniform sampling in accordance with an embodiment.

Non-uniform discrete signal samples are produced by taking samples of an analog input signal 105 at discrete time instants such that the time spacing between any pair of consecutive sampling times may be different from any other pair. Thus, the sampling times are not necessarily equidistant from each other in time. FIG. 4 shows an example of non-uniform sampling. The discrete signal samples are taken at time instants 0, A, B, C, D, E, and so on. The time spaces OA, AB, BC, CD, DE, etc. are dissimilar in this example of non-uniform sampling. Non-uniform sampling allows a user to avoid the Nyquist criteria in order to prevent aliasing. Hence, the average sampling rate and the total number of samples required to detect the presence of a signal in a frequency band can be significantly reduced.

Returning to FIG. 1, the ADC 110 receives the analog input signal 105 and converts it to discrete signal samples 115 taken using non-uniform sampling time periods. The ADC 110 includes a switch that closes at non-uniform time periods determined by the ADC exciter 120, so that the amplitude of the analog input signal is passed through the switch at those non-uniform time periods and otherwise it gets blocked at the switch. This leads to the production of discrete signal samples at non-uniform time periods.

The ADC exciter 120 determines the non-uniform sampling periods at which the ADC 110 samples the analog input signal 105. The memory 112 provides the ADC exciter 120 with a total number of samples N 126 to be taken. The total number of samples N 126 determines the average side lobe energy level when the samples are converted to a frequency domain. The formula $-10 \log(N)$ approximates the average suppression of the side lobe levels relative to the main lobe. For example, if the total number of samples N is 1000, then $-10 \log(N)$ results in an average $-30$ dB suppression of the side lobe level. If, theoretically, only $-20$ dB suppression of the average side lobe level is required to detect main lobes of interest, then the total number of samples N would be set to 100 by the processor 150. The whole duration of the signal, the total number of samples N divided by the average sampling rate R, determines the lobe widths in the frequency domain. For example, if the samples were taken over 1 micro sec, the width of each lobe will be approximately 1 MHz. The average sampling rate could either be predetermined or can be adapted while acquiring the signal. The ADC exciter 120 includes a slope detector 122, a pseudo random generator 124, or a combination of both.

In versions of the ADC exciter 120 with a slope detector 122, the non-uniform sampling times are decided depending upon the slope of the analog input signal 105. In this example, the localized sample spacing is inversely proportional to the currently-detected slope as will be explained with reference to FIG. 4. In this simplified embodiment, the local sampling rate is increased if the slope is steeper and is decreased if the slope is flatter. The slope can increase positively as well as negatively. In FIG. 4 segment 420, the slope is flat and only one sample is taken at C. In segment 410, the slope is steeper positively and two samples are taken at time instants A and B. In segment 430, the slope is steeper negatively and four samples are taken at time instants D, E, F, and G.

Instead of a slope detector 122, a pseudo random generator 124 can be used to determine the spacing between the discrete signal samples to be taken. Pseudo random generators 124 are well known, and the output sequence determines the non-uniform sampling time periods. The pseudo random generator 124 can be adjusted so that the average sampling rate R is generally maintained over the duration of the analog input signal 105 as a whole.

Another variation can be the combination of the slope detector 122 and the pseudo random generator 124. In this combination, the slope detector 122 provides an excitation to the pseudo random generator 124 such that the sampling rate is locally increased within the pseudo random generator 124 when the slope is steeper and the sampling rate is locally decreased when the slope is flatter but the average sampling rate R is generally maintained over the duration of the signal as a whole.

The digital filter 130 converts the discrete signal samples 115 generated by the ADC 110 into an energy versus frequency spectrum 135 in the frequency domain. This is done by taking Fourier transforms of the discrete signal samples. The energy versus frequency spectrum produced by the digital filter 130 can be similar to the simplified one shown in FIG. 3.

The energy comparator 140 detects the presence of any frequency bands exceeding an energy setpoint. The energy setpoint is determined or modified by the processor 150 and provided to the energy comparator 140. The energy setpoint can be determined in a number of ways.

In a first method, the processor 150 determines or modifies the energy setpoint empirically. Such a setpoint, which is fixed at a particular energy level depending on historical or test information, is shown as energy setpoint 360 in the example in FIG. 3. This setpoint 360 happens to lie below two lobes 320 and 330. Depending on the distribution of other energy versus frequency spectra, the setpoint 360 may lie below greater than two lobes or fewer than two lobes. In a second method, the processor 150 determines the energy setpoint such that it lies below some specified number of frequency bands in the energy versus frequency spectrum 135. In the example in FIG. 3, the second type of energy setpoint, setpoint 350, lies below the three highest frequency bands of the energy versus frequency spectrum 135. In other words, the three lobes 310, 320, 330 with the highest energy levels are selected as having frequency bands of interest. For this second method, three lobes are always selected, regardless of the distribution of other energy versus frequency spectra. In a third method, the processor 150 can determine the energy setpoint such that it is a percentage of the lobe 330 with the highest energy level in the energy versus frequency spectrum 135. In the example in FIG. 3, setpoint 370 is the third type of energy setpoint. Here in FIG. 3, the energy setpoint is determined such that it is ninety percent of the highest energy level. In this example only the lobe 330 is selected. In a fourth method, the processor can take the average side lobe height and multiply it by a factor greater than 1 (e.g., 10) to calculate the setpoint. All the lobes higher than the setpoint will be considered as lobes of interest. As a variant of the empirical determination method, the energy setpoint can be a predetermined value that is stored in the energy comparator 140 or memory 112, and in such a case the processor 150 will not be required to modify or select the setpoint.

The processor 150 shown in FIG. 1 can be used for performing other functions such as varying the total number of samples N over the whole signal as well as the average sampling rate R and providing feedback to the ADC exciter 120. The variation of the sampling time periods is based on the fact that, when non-uniformly sampling, the Fourier transform behaves differently compared to uniform sampling. In non-uniform sampling, the side lobes do not die down as in uniform sampling. Instead non-uniform sampling spreads the energy of the aliased lobes into the side lobes. Therefore, there is only one main lobe and no high aliased bands in the Fourier transform of non-uniform digital signal samples. As energy is spread into the side bands, the energy level of the side lobes goes up. Therefore it becomes relatively harder to detect a weak signal in the presence of strong signals. On average, the side lobes are at −10 log(N) dB lower than the main lobe, where N is the total number of samples. As a result, the total number of samples N should be decided such that the side lobe energy level in the frequency domain will be low enough to accommodate the expected dynamic range of the signals.

As stated previously, the energy comparator 140 detects the presence of any frequency bands exceeding an energy setpoint. This is done by comparing the energy of a frequency band from the energy versus frequency spectrum 135 with the energy setpoint that is determined or modified by the processor 150. If the energy of the band is found greater than the energy setpoint, the presence of the signal is indicated; otherwise the mobile device has found no frequency band of interest as previously described with reference to FIG. 3.

The energy comparator 140 optionally includes an accumulator 145. The work of the accumulator 145 starts if the energy comparator 140 fails to identify an adequate number of lobes of interest or identifies too many lobes of interest. In that case 'm' additional sets of N samples can be taken, where 'm' is a whole number greater than 1. In this case, the detection can be made in different ways. One method is by accumulating the energy versus frequency spectrum of each of the 'm' sets. This implies taking the Fourier transforms of the discrete signal samples in each one of the 'm' sets and overlapping them with each other to produce the final energy versus frequency spectrum for analysis by the energy comparator 140. Another way of detecting in this case is by using combinational logic. If a signal is present in more than 'k' out of the 'm' sets of energy versus frequency spectra then the signal is considered to be present at a particular frequency band, otherwise it is considered not present. Finally, the 'm×N' samples can all be digitally filtered to effectively create a frequency spectrum from a larger N value.

The output of the energy comparator is a list of frequencies where a signal of interest potentially exists. This list is further taken up and scanned by the receiver 106 in accordance with known scanning techniques, such as various foreground scanning techniques for signals in the bands of interest.

Figure 2:
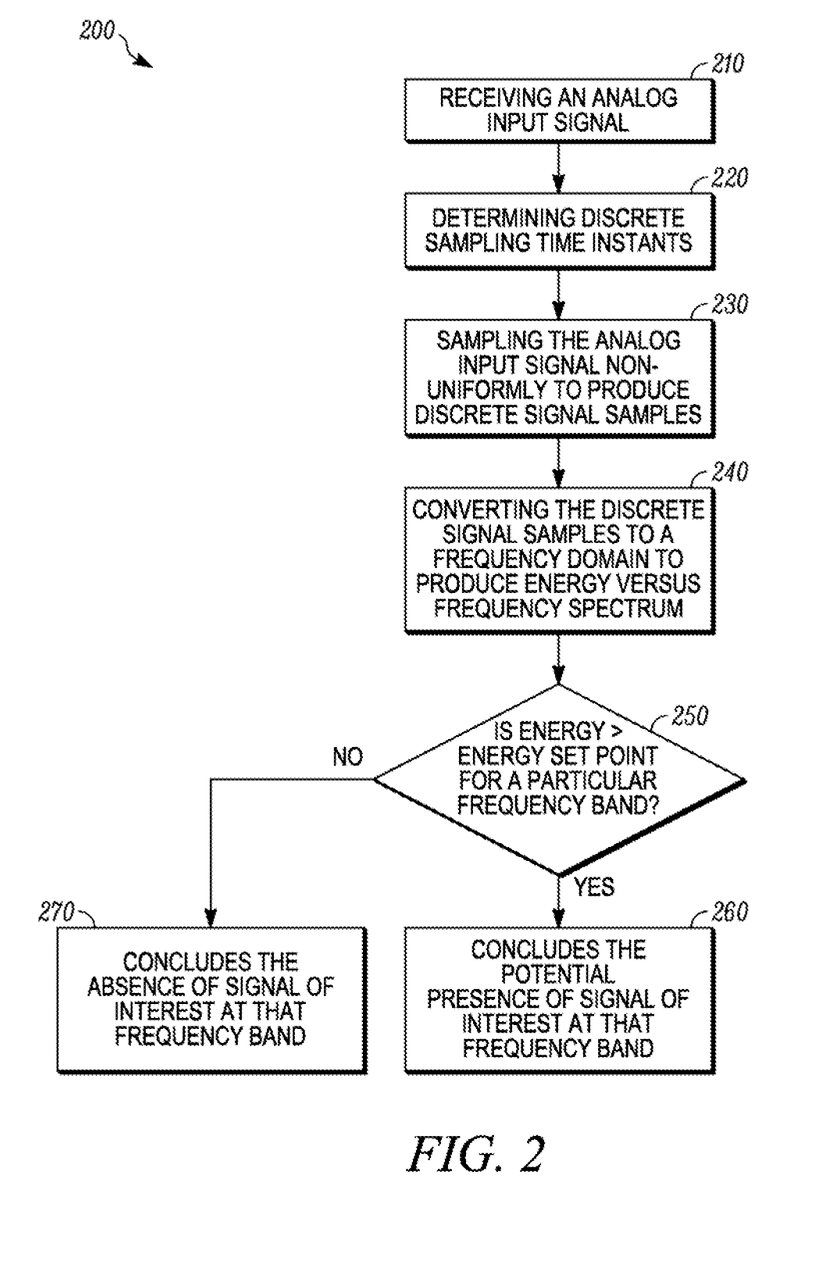
FIG. 2 shows a process flow diagram for a signal detector in accordance with an embodiment.

FIG. 2 shows a process flow diagram 200 for a signal detector such as the signal detector 110 shown in FIG. 1. The signal detector receives 210 an analog input signal. In the example shown in FIG. 1, the ADC 110 within the signal detector 110 receives the analog input signal 105.

The signal detector determines 220 the discrete sampling time instants at which the samples of the analog input signal are to be taken. In FIG. 1, an ADC exciter 120 performs this function. The discrete sampling time instants are the non-uniform sampling time instants at which the analog input signal will be sampled.

The signal detector samples 230 the analog input signal non-uniformly to produce discrete signal samples. In the example shown in FIG. 1, the ADC 110 samples the analog input signal.

The signal detector converts 240 the discrete signal samples to a frequency domain to produce an energy versus frequency spectrum. In the example shown in FIG. 1, the function is performed by a digital filter 130. An example of an energy versus frequency spectrum is explained in detail with reference to FIG. 3.

Returning back to FIG. 2, the signal detector determines 250 if the energy of a frequency band from the energy versus frequency spectrum is greater than an energy setpoint. If so, it concludes 260 the potential presence of a signal of interest at that frequency band. Otherwise, the absence of any signal of interest at that frequency band is concluded 270. In the example shown in FIG. 1, the energy comparator 140 determines 250 and concludes 260, 270 if there potentially is a signal of interest at a particular frequency band. Frequency bands having potential signals of interest are passed to the receiver for further processing. For example, a mobile device may first start foreground scanning using a mode (e.g., GSM 900) that includes the interesting frequency bands and only perform foreground scanning. In other modes (e.g., GSM 1900) if the first mode is unsuccessful.

Figure 3:
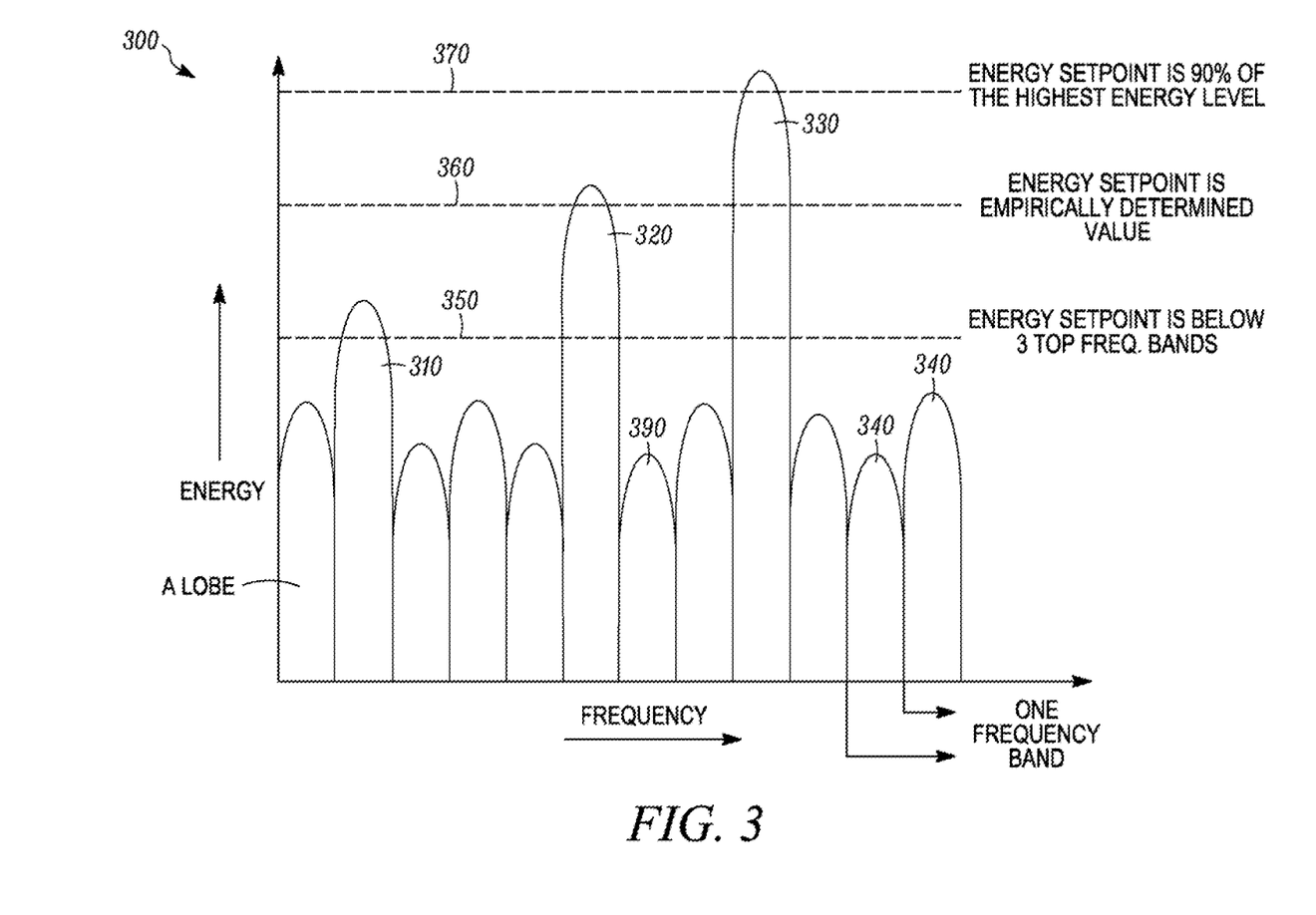
FIG. 3 shows an example energy versus frequency spectrum of the discrete signal samples in accordance with an embodiment.

FIG. 3 shows an example of an energy versus frequency spectrum 300 of discrete signal samples. This energy versus frequency spectrum 300 is similar to the energy versus frequency spectrum 135 shown in FIG. 1. The horizontal axis represents the different frequency bands and the vertical axis represents the energy of the signal at the corresponding frequency band of the horizontal axis. The energy versus frequency spectrum forms lobes 310, 320, 330, 340, 390 and others, which represents a frequency band and its corresponding energy value. As described with reference to FIG. 1, the discrete signal samples of the analog input signal produced by the ADC 110 are converted into an energy versus frequency spectrum using a digital filter 130. The lobes 340 and all the other lobes that lie approximately at the same level may be considered at a side lobe level. Lobes 310, 320, 330 that lie above the side lobe level may be selected as frequency bands of interest, depending on the energy setpoint 350, 360, 370. The horizontal dashed lines show examples of different energy setpoints 350, 360, 370 that assist in determining frequency bands of interest. The energy setpoints are determined or modified, for example, by the processor 150 shown in FIG. 1 in a number of ways.

According to the first method a processor determines or modifies an energy setpoint empirically. Such a setpoint is shown as setpoint 360 in the example in FIG. 3. With reference to the example of FIG. 3, there are two frequency bands that have lobes with 320, 330 energy levels that lie above the setpoint 360. As a result, the frequency bands of lobes 320, 330 are considered of interest. Note that being a frequency band of interest does not necessarily mean that the mobile device will be able to acquire a signal in that band. Thus, known techniques may be used to scan these bands of interest to determine if a signal exists (or if the high energy is being caused by noise) and if the signal can be acquired (or the system emitting the signal is incompatible with the mobile device).

In a second method, the processor determines the energy setpoint such that it lies below some specified number of frequency bands in the energy versus frequency spectrum. In the example in FIG. 3, setpoint 350 is a second type of energy setpoint. It is determined such that it lies below the three highest frequency bands of the energy versus frequency spectrum. In other words, the three lobes with the highest energy values are selected as having frequency bands of interest. In this example, lobes 330, 320, 310 are selected. Note that in this example, lobe 310 is considered a frequency band of interest while other energy setpoints may cause lobe 310 to be considered a side lobe.

A third method determines the energy setpoint such that it is a percentage of the highest energy level in the energy versus frequency spectrum. In the example in FIG. 3, dashed line is this type of the energy setpoint 370. Here in FIG. 3, the energy setpoint 370 is determined such that it is ninety percent of the highest energy level (shown in lobe 330). Thus, according to the third method, only one lobe 330 is selected in this example spectrum 300.

FIG. 4 shows an example 400 of non-uniform sampling of a signal. Non-uniform discrete signal samples are produced by taking samples of an analog signal at discrete time instants such that the time spacing between any pair of consecutive sampling times may be different from any other pair. The sampling times are not necessarily equidistant from each other in time. The discrete signal samples in FIG. 4 are taken at time instants 0, A, B, C, D, E, and so on. The time spaces OA, AB, BC, CD, DE, etc. are dissimilar in this example of non-uniform sampling. These non-uniform sampling time periods are determined using a slope detector and/or a pseudo random generator as described with reference to the ADC exciter 120 shown in FIG. 1.

A slope detector such as 122 determines the non-uniform sampling time instants depending upon the slope of the analog input signal. In the example of FIG. 4, a segment 410 of the analog input signal has a positively steep slope and the number of samples taken is two (A, B). The segment 430 of the analog input signal has a negatively steep slope and the number of samples taken is four (D, E, F, G). On the other hand, segment 420 has a flat slope and only one sample is taken (C).

In FIG. 4, N samples are taken using the pseudo random generator 124 and/or the slope detector 122 by locally varying the average sampling rate R. For example, let N be 100 samples. After 100 samples are taken and filtered, the processor 150 checks whether the actual side lobe suppression is at the desired level calculated using the formula $-10\log(N)$. In cases when the actual side lobe suppression is meets or exceeds the theoretical side lobe suppression, the frequency bands of interest are detected. Otherwise, the signal detector 100 continues taking sets of N=100 samples until the frequency spectrum has the desired side lobe suppression.

In other words, if the 100 samples do not map to the desired side lobe suppression due to factors such as high noise, low instantaneous desired signal power, peak side lobe level being higher than the maximum desired value, etc. causing the deviation of the side lobe energy levels to be great enough to be unreliable, then the processor 150 directs the ADC exciter 120 to take another 100 samples. If 200 samples do not result in the desired side lobe suppression, the processor 150 directs the ADC exciter 120 to take 100 more samples and so on. Therefore, a user can set the relative lobe heights based on the expected dynamic range of the signal. Yet there is flexibility to accommodate instantaneously changing signal energy levels.

For the example in FIG. 4, each of m=7 sets contains N=100 samples to achieve adequate side lobe suppression, of which only 3 samples are shown in the figure for keeping the figure clearer and easier to understand. Since the first set 461 of N=100 samples was not sufficient to obtain an actual side lobe suppression of −20 dB, the processor 150 directed the ADC exciter 120 to take a second set 463 of N=100 more samples. The processor 150 then directs the ADC exciter 120 to continue taking sets of N=100 samples until the desired side lobe suppression was reached. For the example in FIG. 4, the signal detector 100 took seven sets 461, 463, 465, 467, 469, 471, 473 of N=100 samples before reaching the desired side lobe suppression. (As stated previously, only three samples from each set of N=100 samples is shown in the FIG. 4 to enhance clarity). The time duration of each of the 'm' sets is not necessarily equal but each of the 'm' sets carries an equal number of samples.

In the example of FIG. 4:
N total number of samples in each set
T seconds over which the analog input signal is captured
m number of sets taken to reach the desired side lobe suppression.

A first set 461 of m sets (m=7) shows samples A, B, C and actually contains N=100 samples. A second set 463 of m sets (m=7) shows samples D, E, F and actually contains N=100 samples. A third set 465 of m sets (m=7) shows samples G, H, I and actually contains N=100 samples. A fourth set 467 of m sets (m=7) shows samples J, K, L and actually contains N=100 samples. A fifth set 469 of m sets (m=7) shows samples M, N, P and actually contains N=100 samples. A sixth set 471 of m sets (m=7) shows samples Q, R, S and actually contains N=100 samples. A seventh set 473 of m sets (m=7) shows samples U, V, W and actually contains N=100 samples. Note that each group of three samples as shown in a set implies an N=100 group of samples. Also note that values for m and N are provided as an example to make the invention clearer and easier for the reader to understand and may be varied significantly depending on design constraints for the signal detector 100.

As an alternative to taking additional sets of a fixed number N of samples, the processor 150 may vary the number N in accordance with various algorithms (e.g., N increases in accordance with a preset pattern: 100, 200, 500, 1000, N increases in accordance with a formula etc.).

In the embodiments shown, the input signal is analog in nature and is sampled at non-uniform time periods to produce discrete signal samples. Another variation can be receiving a digital input signal where the samples are uniformly spaced. These uniformly spaced samples in the digital signal satisfy the Nyquist criteria. In accordance with the present invention, the digital input signal is down-sampled non-uniformly to create a digital signal with non-uniform sampling time periods, and the resulting signal is processed like the discrete signal samples 115 in accordance with FIG. 1 to achieve the same purpose of decreasing the amount of processing required to find a frequency band of interest.

Thus, the usage of non-uniform sampling for detecting the presence of signal in a frequency band helps avoid aliasing. Non-uniform sampling also allows a reduction in the average sampling rate and uses smaller number of samples for detection of frequency bands of interest. This contributes to detecting frequency bands of interest using less processing power and can very quickly determine frequency bands of interest over a large range of frequencies.

In this document, relational terms such as "first" and "second," "top" and "bottom," and the like may be used solely to distinguish one entity or action from another entity or action without necessarily requiring or implying any actual such relationship or order between such entities or actions. The terms "comprises," "comprising," "includes," "has," or any other variation thereof, are intended to cover a non-exclusive inclusion, such that a process, method, article, or apparatus that "comprises" a list of elements does not include only those elements but may include other elements not expressly listed or inherent to such process, method, article, or apparatus. An element proceeded by "comprises . . . a" or "includes . . . a" or "has . . . a" does not, without more constraints, preclude the existence of additional identical elements in the process, method, article, or apparatus that comprises the element.

I claim:

1. A method for detecting a presence of a signal comprising of:
    generating a pseudo random sequence to determine non-uniform time periods;
    sampling an analog input signal at the non-uniform time periods to produce discrete signal samples;
    determining that a signal is present in a frequency band when an energy versus frequency spectrum of the discrete signal samples exceeds an energy setpoint at the frequency band.

2. The method according to claim 1, wherein sampling comprises:
    detecting a slope of the analog input signal and changing a local sampling rate based on the slope of the analog input signal.

3. The method according to claim 2, wherein the local sampling rate is increased if the slope is steeper.

4. The method according to claim 3, wherein the local sampling rate is increased if the slope is steeper positively.

5. The method according to claim 3, wherein the local sampling rate is increased if the slope is steeper negatively.

6. The method according to claim 2, wherein the local sampling rate is decreased if the slope is flatter.

7. The method of claim 1, wherein the determining comprises:
    converting the discrete signal samples into the energy versus frequency spectrum using digital spectral filtering.

8. The method of claim 7, wherein converting comprises:
    taking Fourier transforms of the discrete signal samples.

9. The method of claim 1, wherein determining comprises:
    setting the energy setpoint.

10. The method of claim 9, wherein setting comprises:
    empirically determining a value for the energy setpoint.

11. The method of claim 9, wherein setting comprises:
    selecting the energy setpoint that lies below a specified number of frequency bands of the energy versus frequency spectrum.

12. The method of claim 9, wherein setting comprises:
    multiplying an average side lobe height by a factor greater than one, wherein the product of the multiplication provides the energy setpoint.

13. The method according to claim 1, further comprising:
taking more discrete signal samples at the non-uniform time periods if a side lobe energy level is greater than expected.

14. An apparatus for use in detecting a presence of a signal comprising:
an analog to digital converter (ADC) for sampling an analog input signal to create the discrete signal samples;
an ADC exciter, coupled to the ADC, for exciting the ADC to sample at non-uniform time periods;
a digital filter, coupled to an output of the ADC, for converting the discrete signal samples into an energy versus frequency spectrum; and
an energy comparator, coupled to an output of the digital filter, to detect a presence of a lobe in the energy versus frequency spectrum exceeding an energy setpoint.

15. The apparatus according to claim 14, wherein the ADC comprises:
a switch that closes at the non-uniform time periods and opens otherwise.

16. The apparatus according to claim 14, wherein the ADC exciter comprises:
a slope detector for detecting a slope of the analog input signal and adjusting a local sampling rate based on the slope of the analog input signal.

17. The apparatus according to claim 14, wherein the ADC exciter comprises:
a pseudo random generator for generating a pseudo random sequence that determines the non-uniform time periods.

18. The apparatus according to claim 14, further comprising:
a processor, coupled to the energy comparator, for determining the energy setpoint.

\* \* \* \* \*